United States Patent
Ebrahimi et al.

(10) Patent No.: US 10,158,382 B2
(45) Date of Patent: Dec. 18, 2018

(54) SIGNAL AMPLIFICATION AND TRANSMISSION BASED ON COMPLEX DELTA SIGMA MODULATOR

(71) Applicant: Telefonaktiebolaget LM Ericsson (publ), Stockholm (SE)

(72) Inventors: Mojtaba Ebrahimi, Toronto (CA); Mohamed Helaoui, Calgary (CA); Fadhel Ghannouchi, Calgary (CA); Fahmi Elsayed, Calgary (CA); Bradley John Morris, Ottawa (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 8 days.

(21) Appl. No.: 15/318,067

(22) PCT Filed: Jun. 23, 2014

(86) PCT No.: PCT/IB2014/062544
§ 371 (c)(1),
(2) Date: Dec. 12, 2016

(87) PCT Pub. No.: WO2015/198092
PCT Pub. Date: Dec. 30, 2015

(65) Prior Publication Data
US 2017/0134055 A1    May 11, 2017

(51) Int. Cl.
*H04B 1/04* (2006.01)
*H03M 3/02* (2006.01)
(Continued)

(52) U.S. Cl.
CPC ............ *H04B 1/0475* (2013.01); *H03M 3/02* (2013.01); *H03M 3/40* (2013.01); *H03M 7/302* (2013.01);
(Continued)

(58) Field of Classification Search
CPC ......... H04B 1/0475; H03F 3/19; H03F 3/245; H03F 2200/451; H03M 7/302;
(Continued)

(56) References Cited

U.S. PATENT DOCUMENTS 7,280,610 B2    10/2007    Matsuura et al.
2003/0123566 A1*  7/2003    Hasson ............... H04L 27/2057
                                                              375/279
(Continued)

OTHER PUBLICATIONS

Bassoo et al., "Analysis of Non-Uniform Polar Quantisers in a Sigma Delta Transmitter Architecture," in IEEE Transactions on Circuits and Systems I: Regular Papers, vol. 59, No. 12, pp. 3060-3070, Dec. 2012.*

(Continued)

*Primary Examiner* — Michelle M Koeth
(74) *Attorney, Agent, or Firm* — Patent Portfolio Builders, PLLC

(57) ABSTRACT

Apparatuses and methods for power amplification and signal transmission using complex delta-sigma modulation are disclosed. In one embodiment, a complex delta sigma modulator unit comprising a complex polar quantizer within an integrator loop is disclosed. The complex polar quantizer quantizes the envelope of a complex integrated signal and produces a complex quantized output signal of substantially constant envelope. The complex quantized output signal is used in deriving a complex feedback signal within the integrator loop of the complex DSM. The complex quantized output signal may be used in driving a power amplifier substantially at saturation. In some embodiments, an adjacent channel power ratio (ACPR) enhancement technique is used to reduce the quantization noise in the complex quantized output signal.

8 Claims, 8 Drawing Sheets

(51) Int. Cl.
  *H03M 7/30* (2006.01)
  *H03M 3/00* (2006.01)
  *H03F 3/24* (2006.01)
  *H03F 3/19* (2006.01)
  *H04L 27/26* (2006.01)

(52) U.S. Cl.
  CPC .............. *H03M 7/3015* (2013.01); *H03F 3/19* (2013.01); *H03F 3/245* (2013.01); *H03F 2200/331* (2013.01); *H03F 2200/451* (2013.01); *H04L 27/2614* (2013.01)

(58) Field of Classification Search
  CPC ........ H03M 7/3015; H03M 3/40; H03M 3/02; H04L 27/2614
  See application file for complete search history.

(56) References Cited

U.S. PATENT DOCUMENTS

| | | | | |
|---|---|---|---|---|
| 2007/0040718 A1* | 2/2007 | Lee | ..................... | H03M 7/3008 341/143 |
| 2009/0319278 A1* | 12/2009 | Yoon | ................... | G10L 19/0212 704/500 |
| 2017/0317686 A1* | 11/2017 | Dartois | ................. | H03M 3/402 |

OTHER PUBLICATIONS

Umali et al., "Quantization Noise Suppression for Envelope Pulse-Width Modulation (EPWM) Transmitters," 2010 IEEE 72nd Vehicular Technology Conference—Fall, Ottawa, ON, 2010, pp. 1-5.*
Ebrahimi et al., "Delta-sigma-based transmitters: Advantages and disadvantages," in IEEE Microwave Magazine, vol. 14, No. 1, pp. 68-78, Jan.-Feb. 2013.*
Bassoo, Vandana et al., "Analysis of Non-Uniform Polar Quantisers in a Sigma Delta Transmitter Architecture," IEEE Transactions on Circuits and Systems-I: Regular Papers, vol. 59, Issue 12, Dec. 2012, IEEE, pp. 3060-3070.
Ebrahimi, Mohammad Mojtaba et al., "Reducing Quantization Noise to Boost Efficiency and Signal Bandwidth in Delta-Sigma-Based Transmitters," IEEE Transactions on Microwave Theory and Techniques, vol. 61, Issue 12, Dec. 2013, IEEE, pp. 4245-4251.
Elsayed, Fahmi et al., "Linear and Efficient Three-Level Polar Delta-Sigma Modulator Based Transmitter," IEEE MTT-S International Microwave Symposium (IMS), Jun. 1-6, 2014, IEEE, 4 pages.
Thiel, Björn Thorsten et al., "Lowpass Delta-Sigma Modulator with Digital Upconversion for Switching-Mode Power Amplifiers," IEEE MTT-S International Microwave Symposium Digest (MTT), Jun. 5-10, 2011, IEEE, 4 pages.
International Search Report and Written Opinion for International Patent Application No. PCT/IB2014/062544, dated Mar. 17, 2015, 15 pages.

* cited by examiner

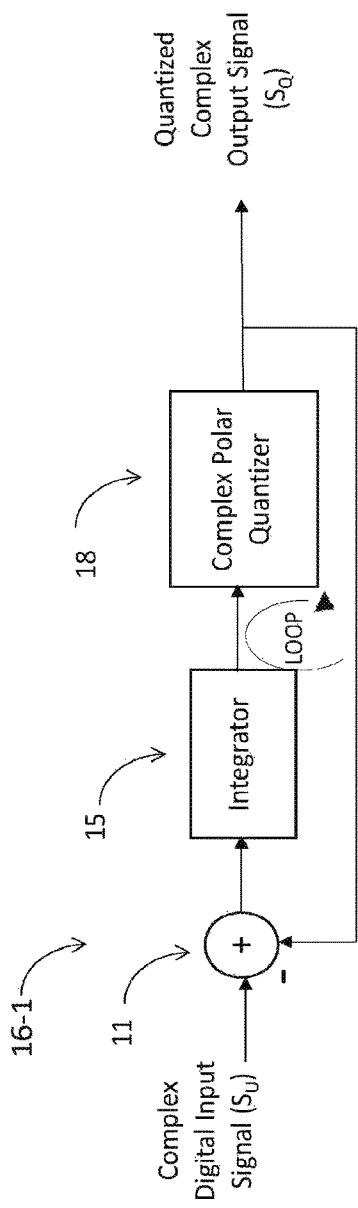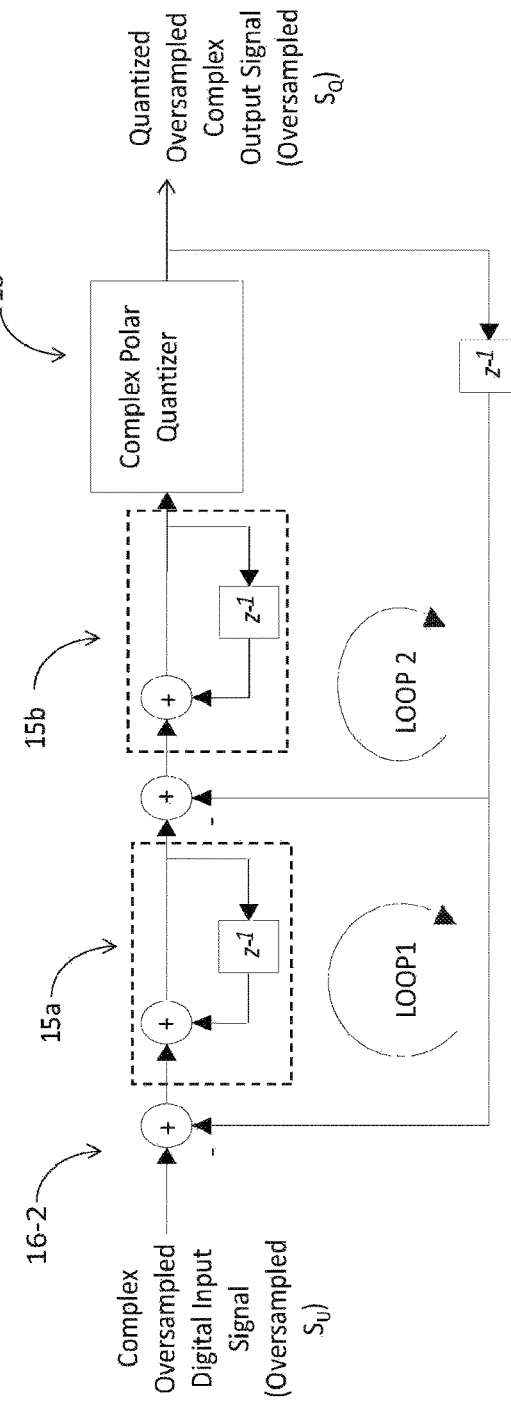
FIGURE 3A
FIGURE 3B

Figure 9-A

Figure 9-B

SIGNAL AMPLIFICATION AND TRANSMISSION BASED ON COMPLEX DELTA SIGMA MODULATOR This application is a 35 U.S.C. § 371 national phase filing of International Application No. PCT/IB2014/062544, filed Jun. 23, 2014, the disclosure of which is incorporated herein by reference in its entirety.

FIELD OF THE DISCLOSURE

The present disclosure relates to complex delta sigma modulation and in particular to signal amplification and transmission based on a complex delta sigma modulator.

BACKGROUND

In a transmitter, most of the power is dissipated in the power amplifier (PA). High throughput signals have higher peak-to-average-power-ratios (PAPRs). To prevent distortion, it is generally desirable that the PA works at a higher power back-off, however this results in lower efficiency of the PA. There are two main solutions to improve the efficiency of the PA: (i) working in lower power back-off and using PA linearizer to compensate the distortion; and (ii) convert a varying-envelope input signal to a constant-envelope signal and use the PA in a high power efficiency region.

Delta sigma modulator (DSM) is one of the techniques to generate a constant-envelope signal from a varying-envelope signal. Generally, a DSM based transmitter consists of a two-level DSM unit that quantizes a time-varying input signal into a one-bit signal while shaping the quantization noise, a signal up-converter that shifts the frequency of the quantized signal to the desired radio frequency (RF) carrier frequency, and one PA (SMPA) that boosts the power of the RF signal before transmission. The PA is often a switch-mode PA (SMPA). Given that the quantized signal has two levels, the envelope of the RF signal feeding the SMPA is constant. As such, no output power back-off is required and the SMPA is driven at saturation at all times, which optimizes its efficiency without substantially affecting the linearity.

Three figures of merit are used to estimate the performance of the DSM based transmitters: coding efficiency (CE), signal-to-noise and distortion ratio (SNDR) and adjacent channel power ratio (ACPR). The CE is the ratio between the in-band signal power to the overall quantized signal power. For many state of the art DSMs, the CE is critically low. Thus, when the SMPA saturates there is a very low desired output power. The overall efficiency of DSM based transmitters can be estimated by the CE of the DSM times the peak efficiency of the SMPA, and as a result of generated quantization noise, the efficiency of two-level DSM based transmitters is very limited. Quantization noise also significantly degrades the ACPR and SNDR of the transmitter, preventing the signal from passing the mask. Known solutions that attempt to improve the SNDR and ACPR often result in a limited signal bandwidth.

There is a need for improved DSM based power amplifiers and transmitters.

SUMMARY

A complex delta-sigma modulator (DSM) unit for processing a complex digital input signal is disclosed. In one embodiment, the DSM unit comprises a subtractor, an integrator and a complex polar quantizer. The subtractor is configured to subtract a feedback signal from the complex digital input signal and produce a delta signal. The integrator is configured to integrate the delta signal into an integrated signal. The complex polar quantizer is configured to quantize the envelope of the integrated signal and to output a complex quantized output signal of substantially constant envelope. The feedback signal is obtained from the complex output signal and is itself complex.

In one embodiment, the complex polar quantizer comprises an envelope calculator configured to determine the envelope of the integrated signal.

In one embodiment, the output signal is obtained by quantizing the envelope of the integrated signal into a quantized envelope and combining the quantized envelope with the phase of the integrated signal. In a further embodiment, the phase of the signal is un-quantized.

In one embodiment, the complex polar quantizer comprises an envelope-phase calculator configured to calculate the envelope and the phase of the integrated signal, a real quantizer configured to quantize the envelope of the integrated signal and an envelope-phase combiner configured to combine the quantized envelope with the phase of the integrated signal into the complex quantized output signal. In another embodiment the complex polar quantizer comprises an envelope calculator configured to determine the envelope of the integrated signal based on an in-phase component and a quadrature component of the integrated signal, a scaling factor calculator configured to calculate a scaling factor based on the determined envelope of the integrated signal and a selected quantization level, and a multiplier configured to produce the complex quantized output signal by multiplying the in-phase component and quadrature component of the integrated signal with the scaling factor.

In one embodiment, a delta-sigma modulator (DSM) based transmitter for transmitting an RF signal over an RF band is disclosed. The DSM based transmitter comprises a digital processing block. The digital processing block comprises a signal interpolator configured to oversample a complex digital input signal into a complex oversampled digital signal and a complex DSM unit configured to process the complex oversampled digital signal into a quantized complex oversampled output signal of substantially constant envelope, using a complex polar quantizer provided within an integrator loop, wherein the complex polar quantizer is configured to quantize the envelope of a complex integrated signal and a complex feedback signal for the integrator loop is obtained from quantized complex oversampled output signal.

In one embodiment, the complex polar quantizer of the DSM based transmitter comprises an envelope calculator configured to determine the envelope of the complex integrated signal.

In one embodiment, the complex DSM based transmitter further comprises an adjacent channel power ratio (ACPR) enhancement unit configured to reduce the amount of noise in the RF signal. The ACPR enhancement unit may comprise a first subtractor, a low pass filter and a second subtractor. The first subtractor may be configured to calculate a total quantization noise as the difference between the quantized complex oversampled output signal and the complex oversampled digital signal. The low pass filter may be configured to extract from the total quantization noise a band specific quantization noise. The second subtractor may be configured to subtract the band specific noise from the quantized complex oversampled output signal.

In one embodiment, the complex DSM based transmitter transmits an RF signal over an RF band and further comprises a signal up-conversion block configured to convert the complex quantized output signal to a radio-frequency (RF) signal and a power amplifier driven by the RF signal substantially at saturation. The signal up-conversion block may comprise a complex up-converter including a digital-to-analog converter (DAC) for an in-phase (I) component of the complex quantized output signal, a digital-to-analog converter (DAC) for a quadrature phase (Q) component of the complex quantized output signal and a frequency up-converter for converting analog outputs of the DAC for the I component and the Q component into an RF signal in a specific RF band.

A method for modulating a complex digital input signal using a complex DSM is also disclosed. In one embodiment, the method comprises subtracting with a subtractor a complex feedback signal from the complex digital input signal to produce a complex delta signal, integrating the complex delta signal into a complex integrated (sigma) signal and quantizing the envelope of the integrated signal using a complex polar quantizer to produce a complex quantized output signal of substantially constant envelope. The feedback signal is obtained from the output signal. In one embodiment, the method further comprises calculating an envelope of the integrated signal. In another embodiment, the method is used for power amplification and further comprises performing an adjacent channel power ratio (ACPR) enhancement technique on the complex quantized output signal to obtain a noise reduced quantized complex signal, up-converting the noise-reduced quantized complex signal to a radio-frequency input signal ($RF_{IN}$) and driving a power amplifier substantially at saturation using the radio-frequency input signal.

Those skilled in the art will appreciate the scope of the present disclosure and realize additional aspects thereof after reading the following detailed description of the embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 3A illustrates a block diagram of a complex DSM unit of the digital processing block in FIG. 2, according to one embodiment of the present disclosure;

FIG. 3B illustrates a block diagram of an alternative complex DSM unit of the digital processing block in FIG. 2, according to one embodiment of the present disclosure;

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Without limitation, the present disclosure describes embodiments of complex DSM units, power amplification based on complex DSM units and wideband high efficiency linear wireless transmitters based on complex DSMs. According to some embodiments, ACPR enhancement techniques are used in combination with complex DSM units for quantization noise reduction.

Figure 1:
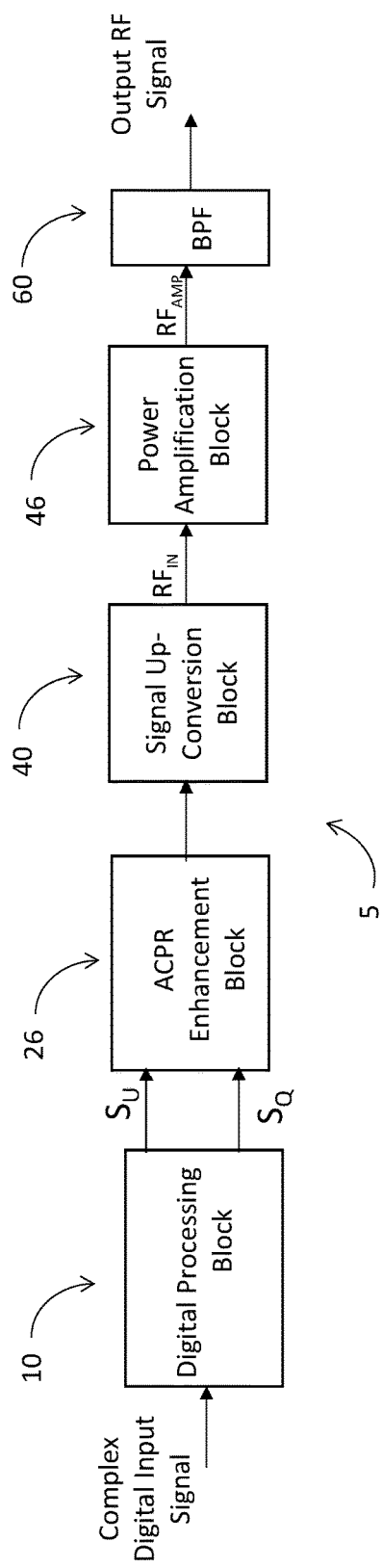
FIG. 1 illustrates a block diagram of a complex DSM based transmitter according to one embodiment of the present disclosure.

FIG. 1 illustrates a block diagram of a complex DSM based transmitter 5 according to one embodiment of the present disclosure. The transmitter 5 includes a digital signal processing block 10, an ACPR enhancement block 26, a signal up-conversion block 40, a power amplification block 46 and an band pass filter (BPF) 60.

A complex digital input signal is received at the input of digital processing block 10, that provides at its output a complex quantized output signal ($S_Q$) and a complex un-quantized output signal ($S_U$). $S_Q$ and $S_U$ are provided at the input of ACPR enhancement block 26 which outputs a noise reduced quantized complex signal. The noise reduced quantized complex signal is up-converted to a radio-frequency input signal ($RF_{IN}$) by the signal up-conversion block 40. $RF_{IN}$ drives a power amplification block 46 the output of which is an amplified radio-frequency signal ($RF_{AMP}$). $RF_{AMP}$ is filtered by the band pass filter 60 to produce an output RF signal. Although not expressly shown in the drawings, in an alternative embodiment, power amplification block 46 directly provides the output RF signal, the band pass filter 60 being optional. In yet another embodiment, the digital processing block 10 outputs only a complex digital output signal which is directly fed into the signal up-conversion block, without passing through the ACPR enhancement block 26.

Figure 2:
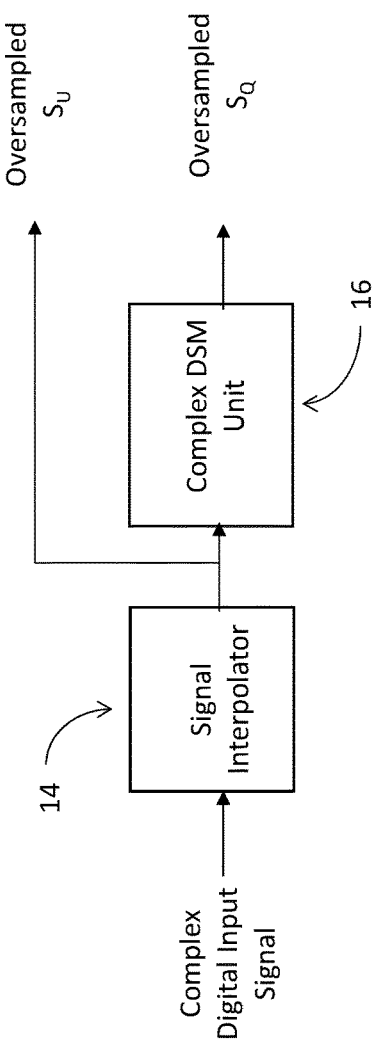
FIG. 2 illustrates a block diagram of a digital processing block of the transmitter in FIG. 1, according to one embodiment of the present disclosure.

FIG. 2 illustrates a block diagram of a digital processing block 10 of the transmitter 5 in FIG. 1, according to one embodiment of the present disclosure. According to this embodiment, digital processing block 10 includes a signal interpolator 14 and a complex delta-sigma modulator unit 16.

In an alternative embodiment, the signal interpolator 14 is optional.

The signal interpolator 14 oversamples the complex digital input signal to a desired oversampling ratio (OSR). The OSR impacts the signal quality in the DSM based transmitter. To achieve a given signal quality, one option consists of choosing a high OSR. The oversampled complex digital signal is fed to the complex DSM unit 16. The complex DSM unit 16 is configured to process a complex digital input signal into a complex quantized output signal of substantially constant envelope. It is noted that when the optional signal interpolator 14 is used, the complex DSM unit is configured to process an oversampled complex digital input signal (oversampled $S_U$) into an oversampled complex quantized output signal (oversampled $S_Q$) of substantially constant envelope. As interpolator 14 is optional, throughout the description and in the drawings, $S_U$ and $S_Q$ are to be understood as oversampled when an interpolator 14 is used, and as not oversampled when an interpolator 14 is not used.

FIGS. 3A and 3B illustrate block diagrams of two alternative embodiments 16-1 and 16-2 of the complex DSM unit 16 of the digital processing block 10 in FIG. 2. In both embodiments, the complex DSM unit comprises a complex polar quantizer 18 within an integrator loop.

The complex DSM unit 16-1 illustrated in FIG. 3A includes a subtractor 11, an integrator 15 and complex polar quantizer 18. The subtractor 11 is configured to subtract a feedback signal from the complex digital input signal and produce a delta signal. The integrator 15 is configured to integrate the delta signal into an integrated (sigma) signal. The complex polar quantizer 18 is configured to quantize the envelope of the integrated signal and to output the complex quantized output signal of a substantially constant envelope. The feedback signal is obtained from the complex output signal, the feedback signal being itself a complex signal. It is noted that the generated output signal may have a varying phase. However, since it has a substantially constant envelope, it is suitable for driving a power-amplifier substantially at saturation, with limited distortion.

FIG. 3B shows a second order DSM unit 16-2, which contains two complex digital integrator loops, LOOP 1 and LOOP 2, corresponding to two separate integrators, 15a and 15b. According to this embodiment, the complex DSM unit 16-2 receives at its input a complex oversampled digital input, such as obtained from signal interpolator 14. In this embodiment, the complex polar quantizer 18 is included within the integrator loop closest to the output of the complex DSM unit.

The different elements of the complex DSM units 16-1 and 16-2 of both embodiments are configured to process complex signals which, as it will be understood by a person skilled in the art, can be represented and processed based on an in-phase component (I) and a quadrature component (Q). In particular, the integrated signals and the feedback signals are complex signals. Moreover, the complex polar quantizer 18 bears the adjective 'polar' as it quantizes the envelope (E) of a complex signal, while the envelope can be associated with a polar representation Eexp(Φ) of a complex signal. Thus, a complex polar DSM is distinct from a conventional Cartesian two-level DSM, where two separate real DSMs are used, one for the in-phase (I) and one for the quadrature (Q) of the signal. The CE of a conventional Cartesian two-level DSM is critically low.

Other complex DSM architectures comprising a complex polar quantizer within an integrator loop, where the complex polar quantizer is configured to quantize the envelope of an integrated signal and to output a complex quantized output signal of a substantially constant envelope, could be used as possible alternatives to the embodiments in FIGS. 3A and 3B.

Figures 4A, 4B:
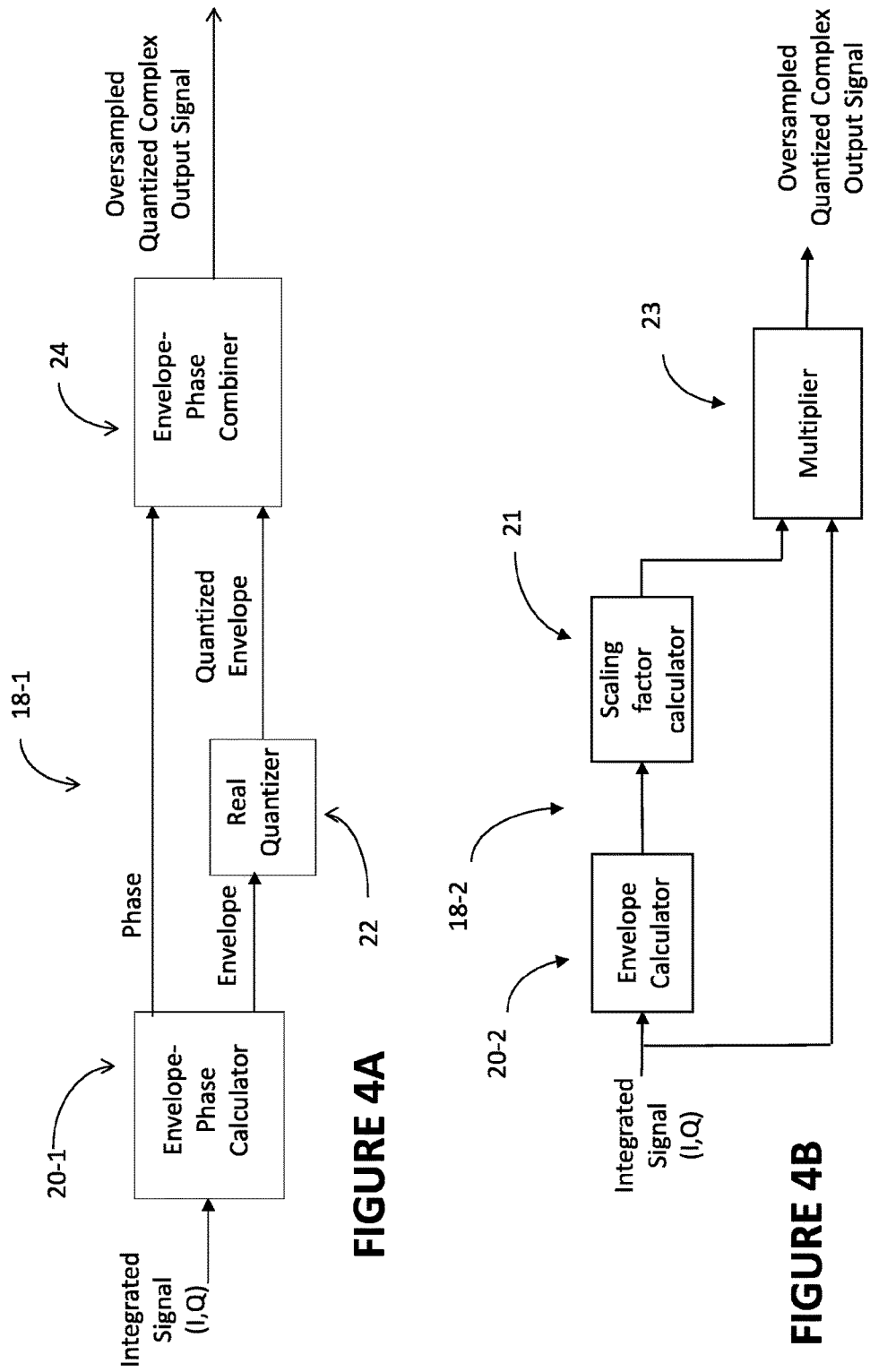
FIG. 4A illustrates a block diagram of a complex polar quantizer of the complex DSM unit in FIGS. 3A and 3B, according to one embodiment of the present disclosure.
FIG. 4B illustrates a block diagram of an alternative complex polar quantizer of the complex DSM unit in FIGS. 3A and 3B, according to one embodiment of the present disclosure.

FIGS. 4A and 4B illustrate block diagrams of two alternative embodiments 18-1 and 18-2 of the complex polar quantizer 18 in FIGS. 3A and 3B.

As shown in FIG. 4A, according to an embodiment of the present disclosure, the variant of the complex polar quantizer denoted with 18-1 includes an envelope-phase calculator 20, a real quantizer 22 and an envelope-phase combiner 24. The envelope-phase calculator 20 is configured to calculate the envelope and the phase of the integrated signal. The real quantizer 22 is configured to quantize the envelope of the integrated signal. The envelope-phase combiner 24 is configured to combine the quantized envelope with the phase of the integrated signal into the complex quantized output signal.

Referring to FIG. 4B, the variant of a complex polar quantizer denoted 18-2 includes an envelope calculator 20-2, a scaling factor calculator 21 and a multiplier 23. The envelope calculator 20-2 is configured to determine the envelope of the integrated signal based on an in-phase component I and a quadrature component Q of the integrated signal. The scaling factor 21 calculator is configured to calculate a scaling factor based on the determined envelope of the integrated signal and a selected quantizing level. The multiplier 23 is configured to produce the complex quantized output signal by multiplying the in-phase component I and quadrature component Q of the integrated signal with the scaling factor.

While the embodiments depicted in FIGS. 4A and 4B include an envelope-phase calculator and an envelope calculator, respectively, it is noted that according to alternative embodiments, a complex polar quantizer may quantize the envelope of an input signal without directly calculating its envelope (E). For example, the quantization of the envelope may be achieved based on the power of the signal, $P=I^2+Q^2$, thus based on the square of the envelope ($E^2=I^2+Q^2$). Other signal characteristics directly related to the envelope of the signal could also be used.

Figure 5:
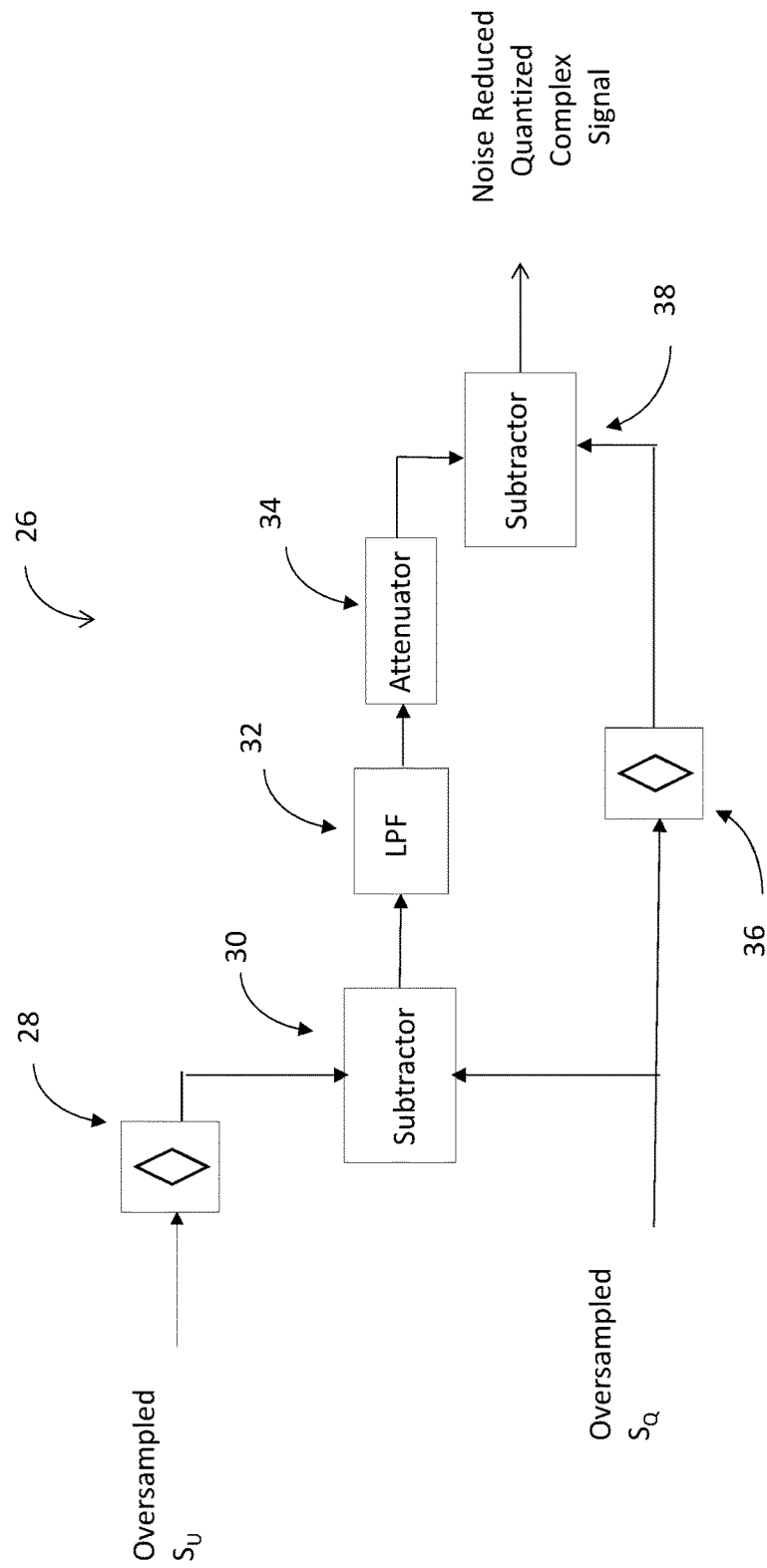
FIG. 5 illustrates a block diagram of an ACPR enhancement block of the transmitter in FIG. 1, according to one embodiment of the present disclosure.

Referring to FIG. 5, an embodiment of ACPR enhancement block 26 from FIG. 1 comprises a first subtractor 30, a low pass filter 32 and a second subtractor 38. The first subtractor 30 is configured to calculate a total quantization noise as the difference between the quantized complex oversampled output signal $S_Q$ and the un-quantized complex oversampled digital signal $S_U$. The low pass filter (LPF) 32 is configured to extract from the total quantization noise a band specific quantization noise. The LPF 32 may be a finite impulse response (FIR) to extract the quantization noise located in the signal channel and in the adjacent channels. The second subtractor 38 is configured to subtract the band specific noise from the quantized complex oversampled output signal $S_Q$. In particular, the second subtractor unit 38 may remove part of the quantization noise from the signal channel and from the adjacent channels. Block 26 may include one complex delay unit 28 to compensate for the DSM unit 16 delay. An attenuator unit 34 may control the level of noise suppression and accordingly the fluctuation of the signal envelope. A second delay unit 36 may compensate the delays such as due to the FIR low pass filter 32, the attenuator 34, the first subtractor 30, etc. The ACPR enhancement block 26 outputs a noise reduced quantized complex signal. It will be recognized by one skilled in the art that while $S_Q$ has a substantially constant envelope and $S_U$ has a time-varying varying envelope, the output of block 26 still has a substantially constant envelope or a quasi-constant envelope.

Figure 6:
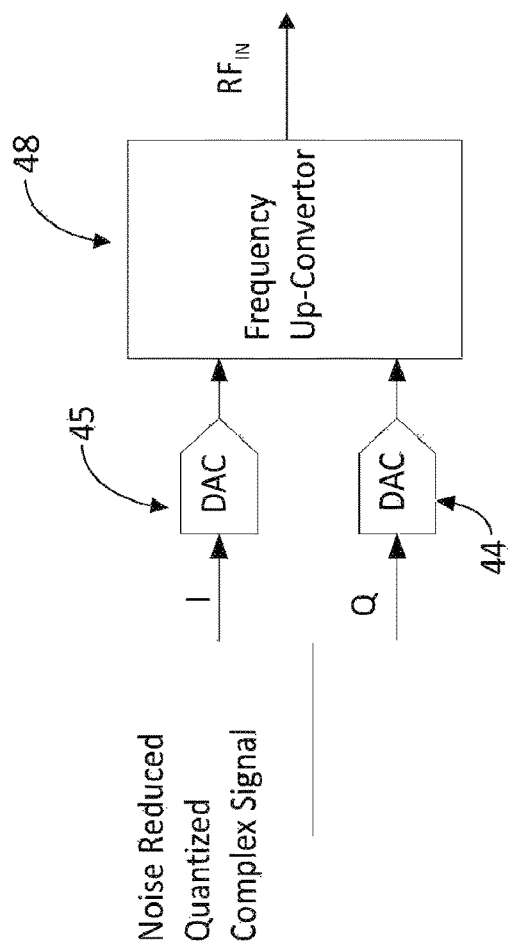
FIG. 6 illustrates a block diagram of a signal up-conversion block of the transmitter in FIG. 1, according to one embodiment of the present disclosure.

FIG. 6 illustrates a block diagram of a signal up-conversion block of the transmitter in FIG. 1, according to one embodiment of the present disclosure. The noise reduced quantized complex data at the output of unit 26 is frequency up-converted to the desired RF carrier frequency by a signal up-conversion block 40. The signal up-conversion block 40 comprises a digital-to-analog converter (DAC) 45 for an in-phase (I) component of the complex quantized output signal, a digital-to-analog converter (DAC) 44 for a quadrature phase (Q) component of the complex quantized output signal. A frequency up-converter 48 is configured to convert analog outputs of the DACs 44, 45 into an RF signal in a specific RF band, ($RF_{IN}$). In combination with the ACPR block 26, signal up-conversion block 40 generates one quasi-constant-envelope RF signal with significantly improved coding efficiency (CE) and enhanced ACPR to pass the transmission mask.

Figure 7:
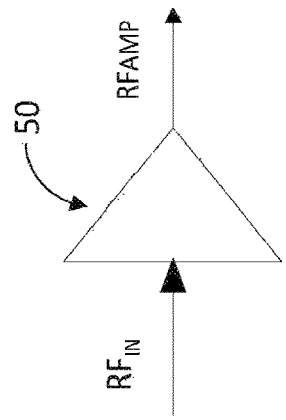
FIG. 7 illustrates a block diagram of a power amplification block of the transmitter in FIG. 1, according to one embodiment of the present disclosure.

FIG. 7 illustrates a block diagram of a power amplification block of the transmitter in FIG. 1, according to one embodiment of the present disclosure. The RF output signal of the up-conversion block 40, $RF_{IN}$, is conveyed to the power amplification block 46 which is responsible for boosting the signal's power before transmission in the form of an amplified radio-frequency signal, $RF_{AMP}$. The power amplification block 46 may include a power efficient amplifier such as a switching-mode power amplifier (SMPA) 50. Since the driving RF signal, $RF_{IN}$, has a quasi-constant envelope, the SMPA is operated substantially at its saturation region, with high efficiency. This provides an opportunity for considerable improvement of the efficiency of the overall transmitter, since the efficiency of the complex DSM based transmitter ($\eta_T$) can be estimated as:

$$\eta_T \cong CE \times \eta_{SMPA}$$

where CE is the overall coding efficiency of the complex DSM and $\eta_{SMPA}$ is the efficiency of the SMPA. As noted above, the complex DSM within the embodiments described herein allow for a significant improvement in CE.

If the fluctuation in signal envelope generated by the ACPR enhancement block 26 is kept within a limited value, the SMPA will not introduce distortion. Therefore, the ACPR can be improved without degrading the signal quality. As a result, the band pass filter 60 at the output of the SMPA need less strict specifications, leading to lower filter loss and better transmitter efficiency.

Based on the above, a complex DSM based transmitter with ACPR enhancement technique as disclosed herein offers better signal linearity in terms of ACPR and higher power efficiency compared to conventional Cartesian two-level based DSM transmitters.

Figure 8:
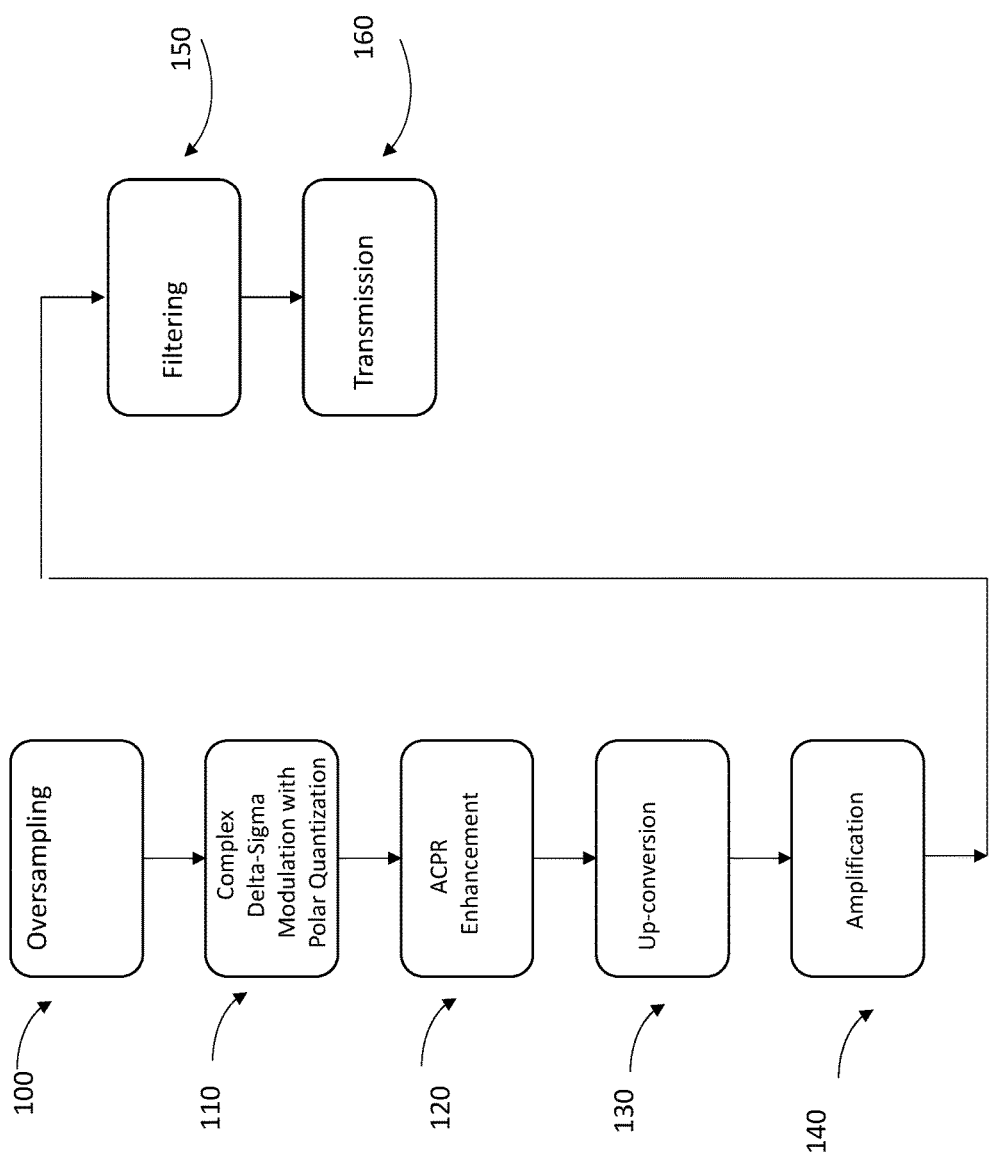
FIG. 8 illustrates a flow chart that illustrates the operation of a complex DSM based transmitter, according to one embodiment of the present disclosure.

FIG. 8 illustrates a flow chart for a method for transmitting a complex digital input signal using a complex DSM. The method comprises complex delta-sigma modulating a complex digital input signal, 110, to produce a quantized signal of substantially constant envelope. Prior to complex delta-sigma modulating the complex digital input signal, oversampling the complex digital signal to a desired oversampling ratio OSR, 100, may be performed. Complex delta-sigma modulating the complex digital input signal comprises subtracting with a subtractor a complex feedback signal from the complex digital input signal to produce a complex delta signal, integrating the complex delta signal into a complex integrated (sigma) signal and quantizing the envelope of the integrated signal using a complex polar quantizer to produce a complex quantized output signal of substantially constant envelope. The feedback signal is obtained from the complex output signal and is also a complex signal. In one embodiment, the method further comprises calculating an envelope of the integrated signal. In another embodiment, the method is used for power amplification and further comprises The method of transmitting may include performing an adjacent channel power ratio (ACPR) enhancement technique on the complex quantized output signal to obtain a noise reduced quantized complex signal, 120. The method of transmitting comprises up-converting the quantized complex signal, 130, possibly after noise reduction through ACPR enhancement, to a radio-frequency input signal ($RF_{IN}$), and driving a power amplifier substantially at saturation using the radio-frequency input signal, 140. The amplified radio signal is transmitted, 160, possibly after band pass filtering, 150.

The method comprises complex polar sigma-delta modulating a digital input signal to produce a quantized signal of substantially constant envelope (110), power amplifying the quantized signal (140) and transmitting the signal (160). Complex polar sigma-delta modulating a complex digital input signal (110) is achieved using a complex DSM and comprises subtracting with a subtractor a feedback signal from the complex digital input signal to produce a delta signal, integrating the delta signal into an integrated (or sigma) signal, and quantizing the envelope of the integrated signal using a complex polar quantizer to produce a complex quantized output signal of substantially constant envelope. The feedback signal is obtained from the output signal. In some embodiments, Complex polar sigma-delta modulating a complex digital input signal may further comprise calculating an envelope of the integrated signal.

The operation of a complex DSM based transmitter may further comprise one or more of the following steps: oversampling the complex digital input signal to a desired oversampling ratio OSR (100), performing an adjacent channel power ratio (ACPR) enhancement technique on the complex quantized output signal to obtain a noise reduced quantized complex signal (120), up-converting the quantized signal to a radio-frequency input signal ($RF_{IN}$) (130) and driving a power amplifier substantially at saturation using the radio-frequency input signal ($RF_{IN}$).

Figure 9:
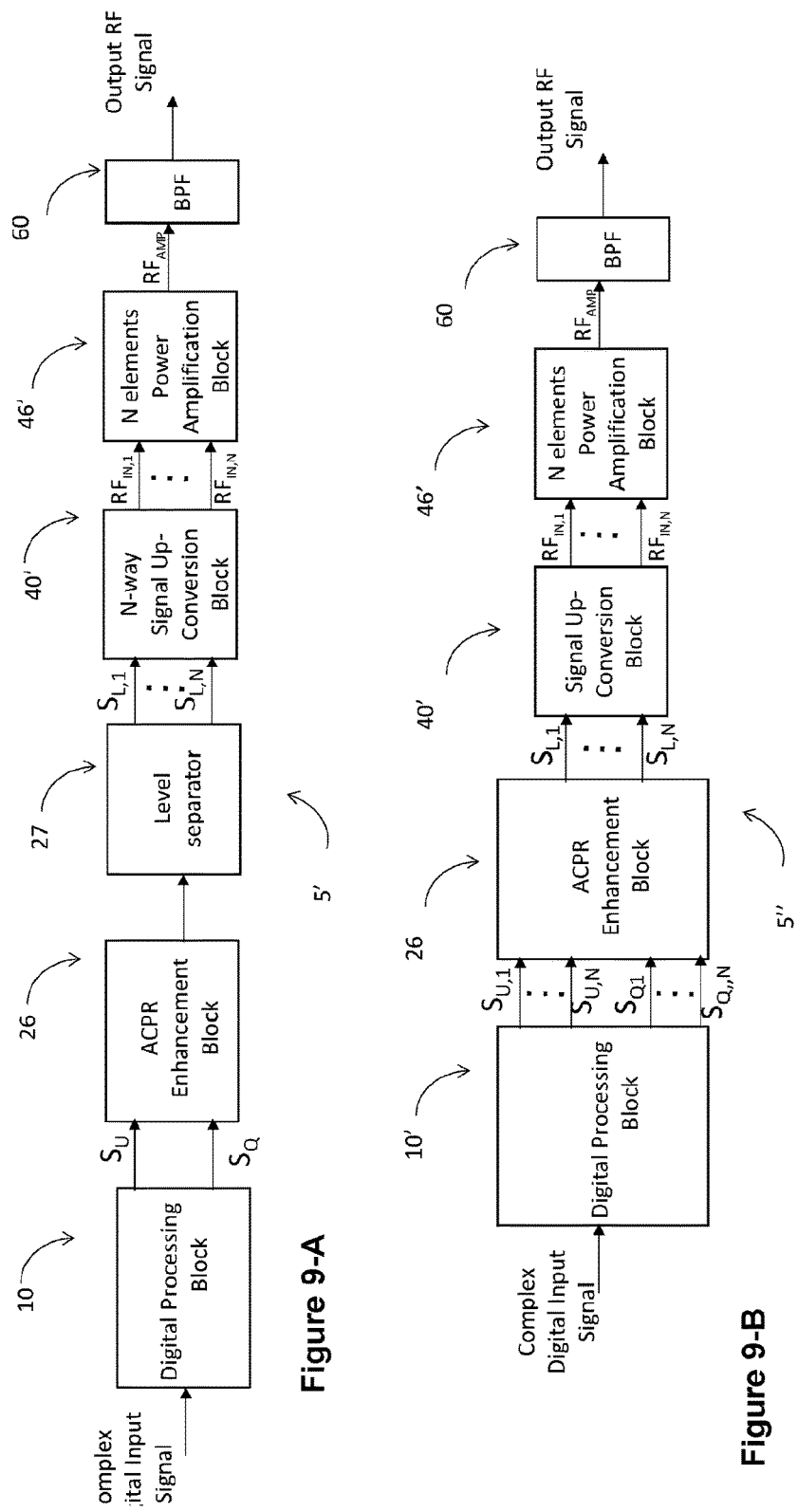
FIGS. 9A, 9B and 10 illustrate block diagrams of N-level complex DSM architectures, according to further embodiments of the present disclosure.
Figure 10:
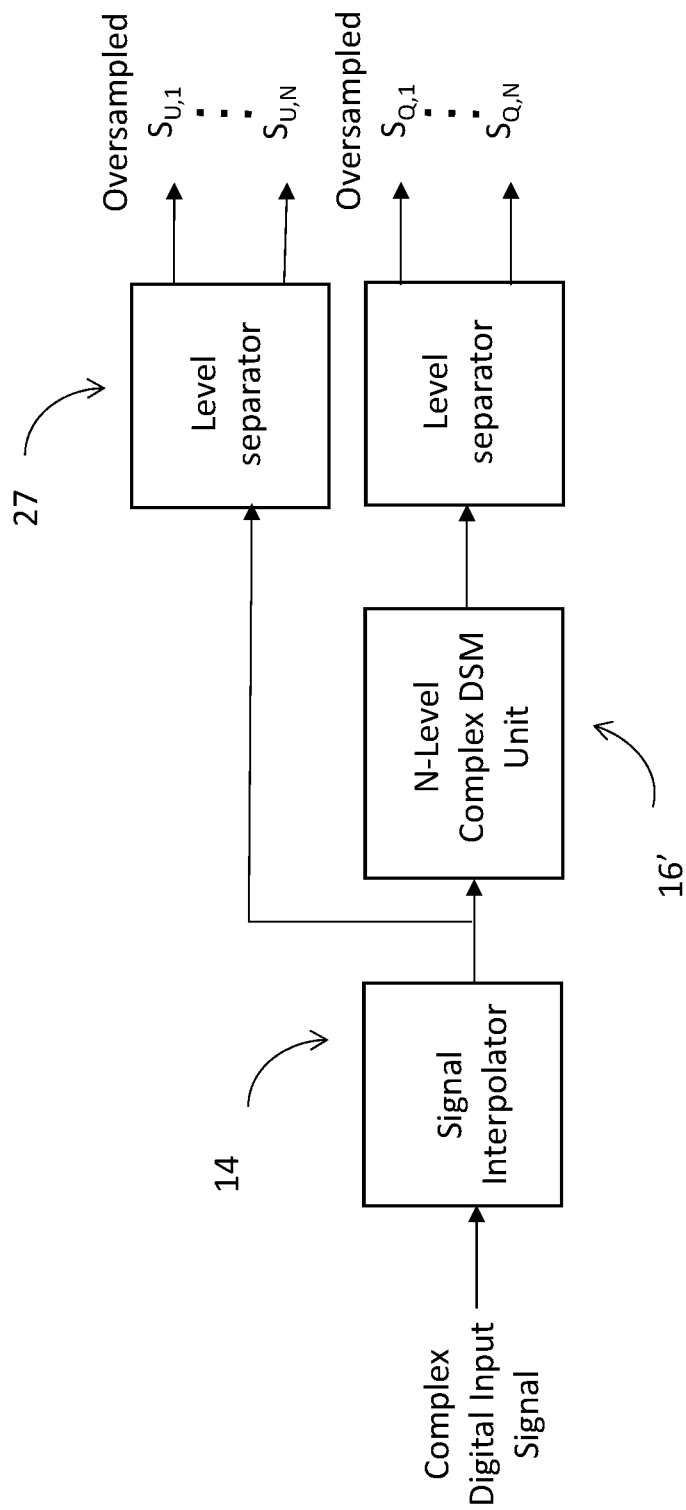

The embodiment of the proposed DSM transmitter architecture can be generalized to multi-level DSM implementations 5', 5", as shown in FIGS. 9A, 9B and 10 Corresponding numerals are used for blocks with the same or similar functionality. In these embodiments, a complex DSM is a N-level (N is an integer higher or equal to 2) complex delta-sigma modulator, as represented by 16' in FIG. 10. The N-level DSM 16' may have the same topology as the DSM shown in FIGS. 2, 3A, 3B, 4A, 4B with the exception that the complex polar quantizer 18, 18-1, 18-2, is an N-level quantizer. The output is therefore a complex signal with quantized envelope and shaped quantization noise.

In a first example of implementation (FIG. 9-A), the ACPR enhancement block 26 is applied to the N-level quantized output from the complex DSM. The output signal from the ACPR enhancement block 26 is then separated to N signals ($S_{L,1}, \ldots, S_{L,N}$) using a level separator block 27. Each signal corresponds to one of the N levels with the summation of all the signals allows to reconstruct the multilevel signal. These N signals ($S_{L,1}, \ldots, S_{L,N}$) are passed through an N-branch RF front-end composed of N-way frequency up-converter 40', N-element power amplification block 46' and a band-pass filter 60.

In a second example of implementation (FIG. 9-B and FIG. 10), the output of the N-level complex DSM 16' is separated to N signals ($S_{Q,1}, \ldots, S_{Q,N}$) then each of the signals is passed through an ACPR enhancement block 26 to generate the N signals ($S_{L,1}, \ldots, S_{L,N}$) before passing through the N-branch RF front-end.

Embodiments disclosed herein may be implemented to provide numerous advantages. While the embodiments disclosed herein are not limited by or to any particular advantage, a number of examples are provided below. As one example, complex DSM based transmitters according to disclosed embodiments have a high efficiency, since their coding efficiency CE is improved and the PAs are driven close to the saturation region, which is the highest efficiency region of a PA.

Furthermore, the architecture of the transmitter in some embodiments disclosed herein is inherently linear, thus there is no need for any predistortion techniques, which reduces the complexity of the digital signal processing part of the transmitter and therefore reduces its energy consumption.

Some ACPR enhancement techniques disclosed herein provide the opportunity for reducing the constraints on the band-pass filtering at the output of the power amplifier, leading to an overall better efficiency for the transmitter.

The following acronyms are used throughout this disclosure.

ACPR: Adjacent Channel Power Ratio
BPF: Band Pass Filter
CE: Coding Efficiency
DAC: Digital to Analog Converter
DPD: Digital PreDistortion
DSM: Delta Sigma Modulator
FIR: finite Impulse Response
LPF: Low pass filter
OFDM: Orthogonal Frequency Division Multiplexing
OSR: Oversampling Ratio
PA: Power Amplifier
PAPR: Peak to Average Power Ratio
RF: Radio Frequency
SMPA: Switched-Mode Power Amplifier
SNDR: Signal-to-Noise and Distortion Ratio It will be understood by those skilled in the art, without further specific mention, that all blocks may perform the tasks ascribed to them using a combination of hardware, firmware and software control. Engineering considerations drive the allocation of functions to software, firmware and/or hardware. In particular, all blocks may employ a software program which performs the ascribed functions, or directs hardware to perform the ascribed tasks in functional modules prepared for such tasks. At least some of the physical communication must be performed in hardware, but data manipulations may be performed by a computer operating under software control, or by microprocessors operating under firmware control, or by ASICs, a portion of which is used for the specific data manipulations which are required.

Those skilled in the art will recognize improvements and modifications to the embodiments of the present disclosure. All such improvements and modifications are considered within the scope of the concepts disclosed herein and the claims that follow.

What is claimed is:

1. A complex delta-sigma modulator (DSM) for processing a complex digital input signal, the complex DSM comprising:
  a subtractor configured to subtract a complex feedback signal from the complex digital input signal and produce a delta signal;
  an integrator configured to integrate the delta signal into an integrated signal; and
  a complex polar quantizer that comprises a processor configured to quantize an envelope of the integrated signal and output a complex quantized output signal of substantially constant envelope, wherein the processor is further configured to:
    determine the envelope of the integrated signal, based on an in-phase component and a quadrature component of the integrated signal;
    calculate a scaling factor, based on the determined envelope of the integrated signal and a selected quantization level; and
    produce the complex quantized output signal, by multiplication of the in-phase component and the quadrature component of the integrated signal with the scaling factor, wherein the complex feedback signal is obtained from the complex quantized output signal.

2. A complex delta-sigma modulator (DSM) based transmitter for transmitting a radio-frequency (RF) signal over an RF band, the complex DSM based transmitter comprising:
  a digital processing block, wherein the digital processing block comprises:
    a signal interpolator configured to oversample a complex digital input signal into a complex oversampled digital signal; and
    a complex DSM configured to process the complex oversampled digital signal into a quantized complex oversampled output signal of substantially constant envelope, using a complex polar quantizer provided within an integrator loop, wherein the complex polar quantizer comprises a processor configured to quantize the envelope of an integrated signal, and a complex feedback signal for the integrator loop is obtained from the quantized complex oversampled output signal, and wherein the processor is further configured to:
      determine the envelope of the integrated signal, based on an in-phase component and a quadrature component of the integrated signal;
      calculate a scaling factor, based on the determined envelope of the integrated signal and a selected quantization level; and
      produce the quantized complex oversampled output signal, by multiplication of the in-phase component and the quadrature component of the integrated signal with the scaling factor.

3. The complex DSM based transmitter as in claim 2, further comprising an adjacent channel power ratio (ACPR) enhancement block configured to reduce an amount of noise in the RF signal.

4. The complex DSM based transmitter as in claim 3, wherein the ACPR enhancement block comprises:
  a first subtractor configured to calculate a total quantization noise as a difference between the quantized complex oversampled output signal and the complex oversampled digital signal;
  a low pass filter configured to extract from the total quantization noise a band specific quantization noise; and
  a second subtractor configured to subtract the band specific quantization noise from the quantized complex oversampled output signal.

5. A transmitter comprising:
  a complex delta-sigma modulator (DSM) providing a complex quantized output signal of substantially constant envelope, the complex DSM comprising:
    a subtractor configured to subtract a complex feedback signal from a complex digital input signal and produce a delta signal;

an integrator configured to integrate the delta signal into an integrated signal; and a complex polar quantizer that comprises a processor configured to quantize an envelope of the integrated signal and output the complex quantized output signal of substantially constant envelope, wherein the processor is further configured to:

determine the envelope of the integrated signal, based on an in-phase component and a quadrature component of the integrated signal;

calculate a scaling factor, based on the determined envelope of the integrated signal and a selected quantization level; and produce the complex quantized output signal of substantially constant envelope, by multiplication of the in-phase component and the quadrature component of the integrated signal with the scaling factor, wherein the complex feedback signal is obtained from the complex quantized output signal of substantially constant envelope;

a complex up-converter configured to convert the complex quantized output signal of substantially constant envelope to an input radio-frequency signal ($RF_{IN}$); and a power amplifier driven by the $RF_{IN}$ substantially at saturation.

6. The transmitter as in claim 5, wherein the complex up-converter includes: a first digital-to-analog converter (DAC) for an in-phase (I) component of the complex quantized output signal of substantially constant envelope, a second digital-to-analog converter (DAC) for a quadrature phase (Q) component of the complex quantized output signal of substantially constant envelope, and a frequency up-converter for converting analog outputs of the first DAC for the I component and the second DAC for the Q component into an RF signal in a specific RF band.

7. A method for modulating a complex digital input signal using a complex delta-sigma modulator (DSM), the method comprising:

subtracting, with a subtractor, a complex feedback signal from the complex digital input signal to produce a delta signal;

integrating the delta signal into an integrated signal; and quantizing an envelope of the integrated signal, using a complex polar quantizer, to produce a complex quantized output signal of substantially constant envelope, wherein quantizing the envelope of the integrated signal comprises:

determining the envelope of the integrated signal, based on an in-phase component and a quadrature component of the integrated signal;

calculating a scaling factor, based on the determined envelope of the integrated signal and a selected quantization level; and multiplying, the in-phase component and the quadrature component of the integrated signal with the scaling factor, to produce the complex quantized output signal, wherein the complex feedback signal is obtained from the complex quantized output signal.

8. A method for power amplification, the method comprising:

modulating a complex digital input signal to obtain a complex quantized output signal of substantially constant envelope, wherein modulating the complex digital input signal comprises:

subtracting, with a subtractor, a complex feedback signal from the complex digital input signal to produce a delta signal;

integrating the delta signal into an integrated signal; and quantizing an envelope of the integrated signal, using a complex polar quantizer, to produce the complex quantized output signal of substantially constant envelope, wherein quantizing the envelope of the integrated signal comprises:

determining the envelope of the integrated signal, based on an in-phase component and a quadrature component of the integrated signal;

calculating a scaling factor, based on the determined envelope of the integrated signal and a selected quantization level; and multiplying, the in-phase component and the quadrature component of the integrated signal with the scaling factor, to produce the complex quantized output signal of substantially constant envelope, wherein the complex feedback signal is obtained from the complex quantized output signal of substantially constant envelope;

performing an adjacent channel power ratio (ACPR) enhancement technique on the complex quantized output signal of substantially constant envelope to obtain a noise reduced quantized complex signal;

up-converting the noise reduced quantized complex signal to a radio-frequency input signal ($RF_{IN}$); and driving a power amplifier substantially at saturation using the $RF_{IN}$.

* * * * *